United States Patent
Pachla

(10) Patent No.: US 11,591,210 B2
(45) Date of Patent: Feb. 28, 2023

(54) METHOD AND APPARATUS FOR A TRANSDUCER ASSEMBLY WITH A STANDOFF

(71) Applicant: Knowles Electronics, LLC, Itasca, IL (US)

(72) Inventor: Timothy Pachla, Berwyn, IL (US)

(73) Assignee: Knowles Electronics, LLC, Itasca, IL (US)

( * ) Notice: Subject to any disclaimer, the term of this patent is extended or adjusted under 35 U.S.C. 154(b) by 304 days.

(21) Appl. No.: 17/063,722

(22) Filed: Oct. 6, 2020

(65) Prior Publication Data

US 2022/0106185 A1 Apr. 7, 2022

(51) Int. Cl.
  *B81B 7/00* (2006.01)
  *B81B 3/00* (2006.01)
  *H04R 19/04* (2006.01)
  *H04R 31/00* (2006.01)
  *H04R 19/00* (2006.01)

(52) U.S. Cl.
  CPC .......... *B81B 7/0048* (2013.01); *B81B 3/0021* (2013.01); *B81B 3/0072* (2013.01); *H04R 19/005* (2013.01); *H04R 19/04* (2013.01); *H04R 31/00* (2013.01); *B81B 2201/0257* (2013.01); *H04R 2201/003* (2013.01)

(58) Field of Classification Search
  CPC ................ B81B 3/0021; B81B 3/0072; B81B 2201/0257; B81B 7/0048; H04R 19/04; H04R 19/005; H04R 2201/003; H04R 31/00
  See application file for complete search history.

(56) References Cited

U.S. PATENT DOCUMENTS

| | | | |
|---|---|---|---|
| 8,450,817 B2 | 5/2013 | Minervini | |
| 9,334,153 B1* | 5/2016 | Perahia | B81C 1/00301 |
| 2009/0190319 A1* | 7/2009 | Hatakeyama | H01L 25/0657 361/803 |
| 2018/0057353 A1* | 3/2018 | Lee | H01L 25/065 |
| 2019/0341885 A1* | 11/2019 | Jackson | H03B 5/326 |

OTHER PUBLICATIONS

Lee, U.S. Appl. No. 63/005,162 U.S. Patent and Trademark Office, filed Apr. 3, 2020.

* cited by examiner

*Primary Examiner* — Yasser A Abdelaziez
(74) *Attorney, Agent, or Firm* — Loppnow & Chapa; Matthew C. Loppnow

(57) ABSTRACT

A transducer assembly can include a base. The transducer assembly can include a stress isolation standoff located on the base. The transducer assembly can include a MEMS die disposed on the stress isolation standoff. The transducer assembly can include a die attach adhesive disposed between the MEMS die and the base. The die attach adhesive can bond the MEMS die to the base. The stress isolation standoff can be embedded in the die attach adhesive between the base and the MEMS die.

10 Claims, 5 Drawing Sheets

METHOD AND APPARATUS FOR A TRANSDUCER ASSEMBLY WITH A STANDOFF

BACKGROUND

1. Field

The present disclosure is directed to a method and apparatus for a transducer assembly with a standoff. More particularly, the present disclosure is directed to a transducer assembly including a Microelectromechanical Systems (MEMS) die on a standoff.

2. Introduction

Presently, consumer electronic devices like mobile phones, personal computers, smart speakers, hearing aids, True Wireless Stereo (TWS) earphones among other host devices commonly incorporate one or more small microphones and/or sensors. Advancements in micro and nano-fabrication technologies have led to the development of microphones and sensors having progressively smaller size and different form-factors. For example, the once predominate use of electret microphones in these and other applications is being supplanted by capacitive MEMS microphones for their low cost, small size and high sensitivity.

BRIEF DESCRIPTION OF THE DRAWINGS

In order to describe the manner in which advantages and features of the disclosure can be obtained, a description of the disclosure is rendered by reference to specific embodiments thereof which are illustrated in the appended drawings. These drawings depict only example embodiments of the disclosure and are not therefore considered to limit its scope. The drawings may have been simplified for clarity and are not necessarily drawn to scale.

DETAILED DESCRIPTION

Embodiments provide a method and apparatus for a transducer assembly with a standoff. According to a possible embodiment, a transducer assembly can include a base. The transducer assembly can include a stress isolation standoff located on the base. The transducer assembly can include a MEMS die disposed on the stress isolation standoff. The transducer assembly can include a die attach adhesive disposed between the MEMS die and the base. The die attach adhesive can bond the MEMS die to the base. The stress isolation standoff can be embedded in the die attach adhesive between the base and the MEMS die.

Figure 1:
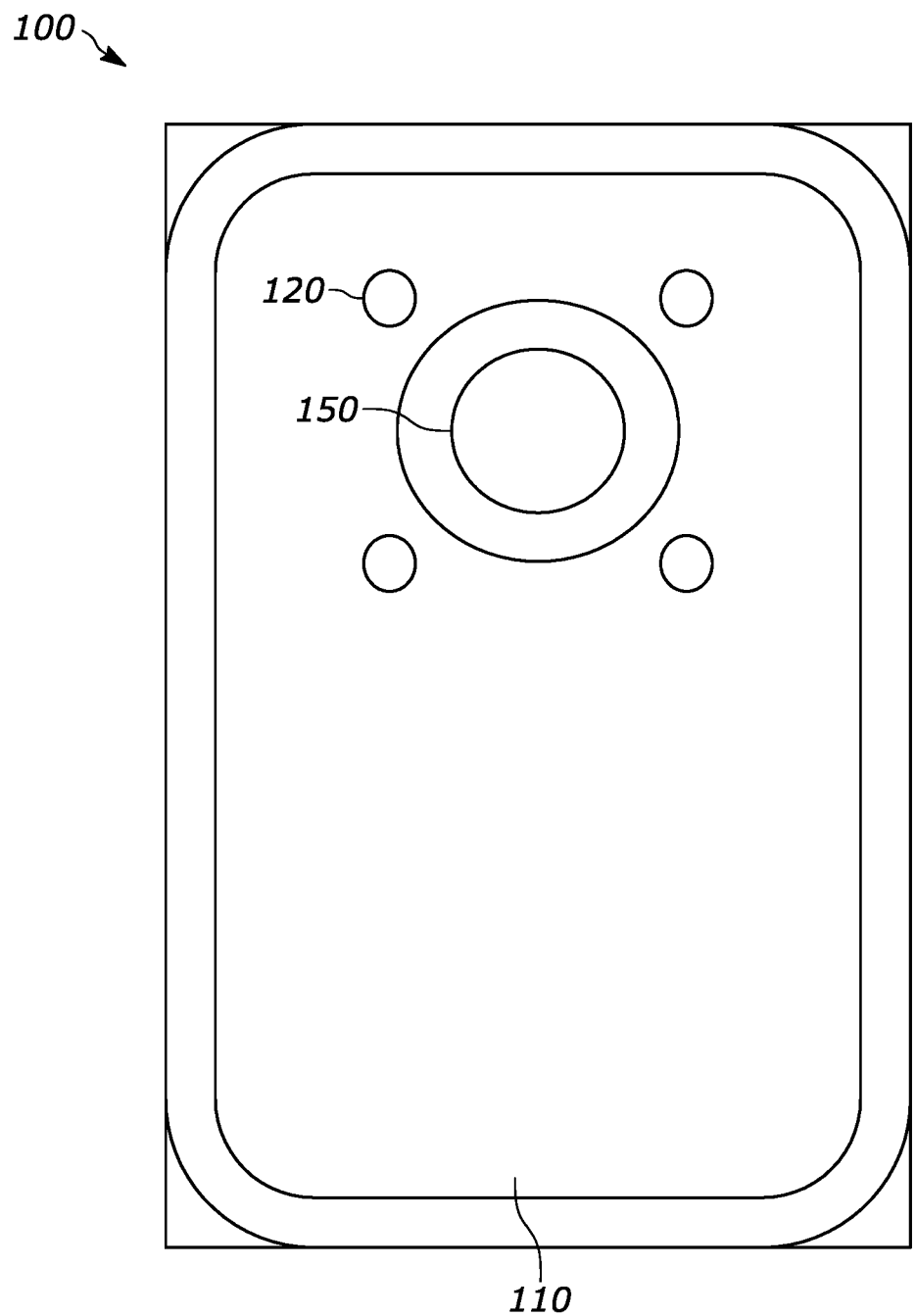
FIGS. 1 and 2 are example top plan views of a transducer sub-assembly in different stages of assembly according to a possible embodiment.
Figure 2:
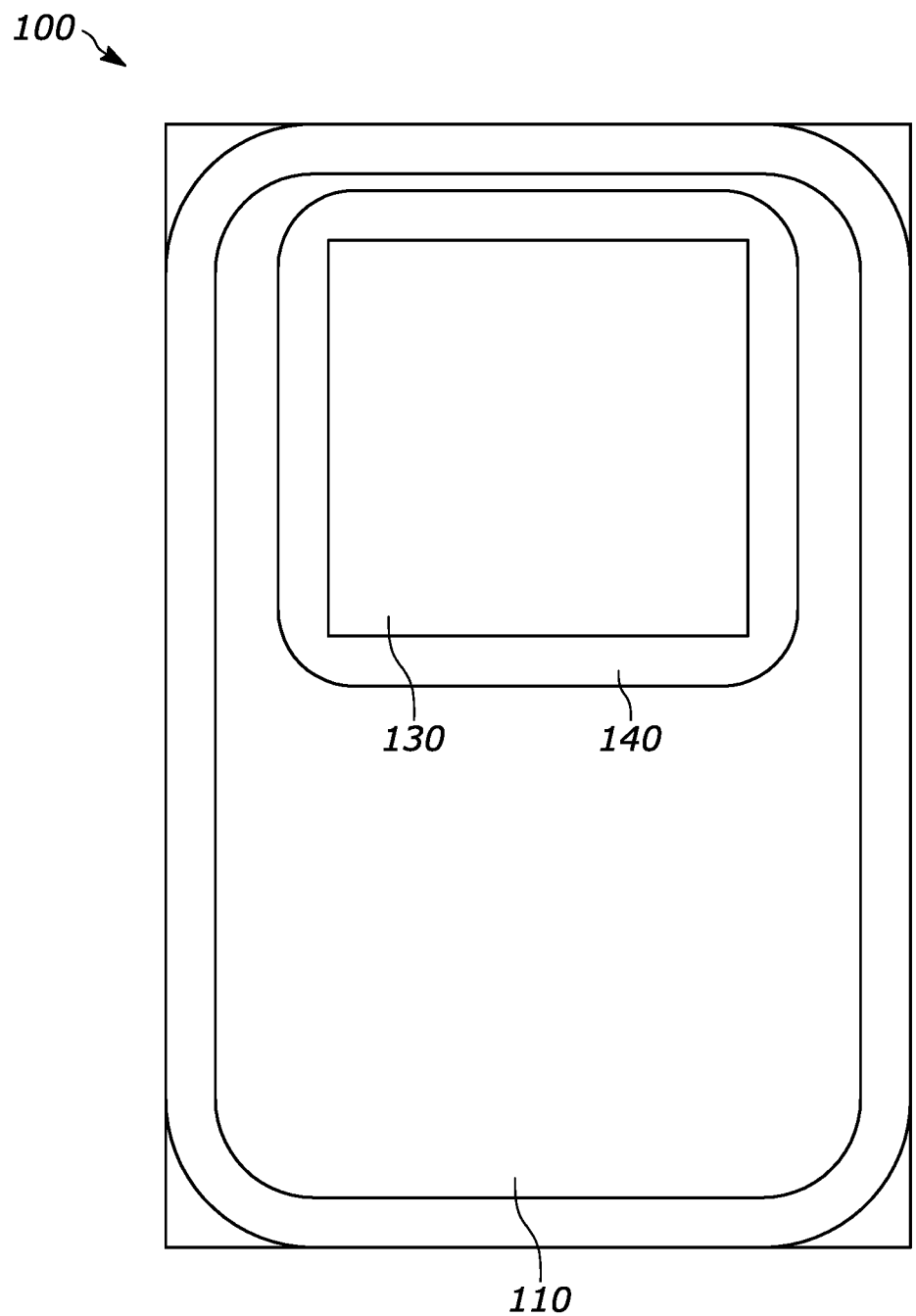
Figure 3:
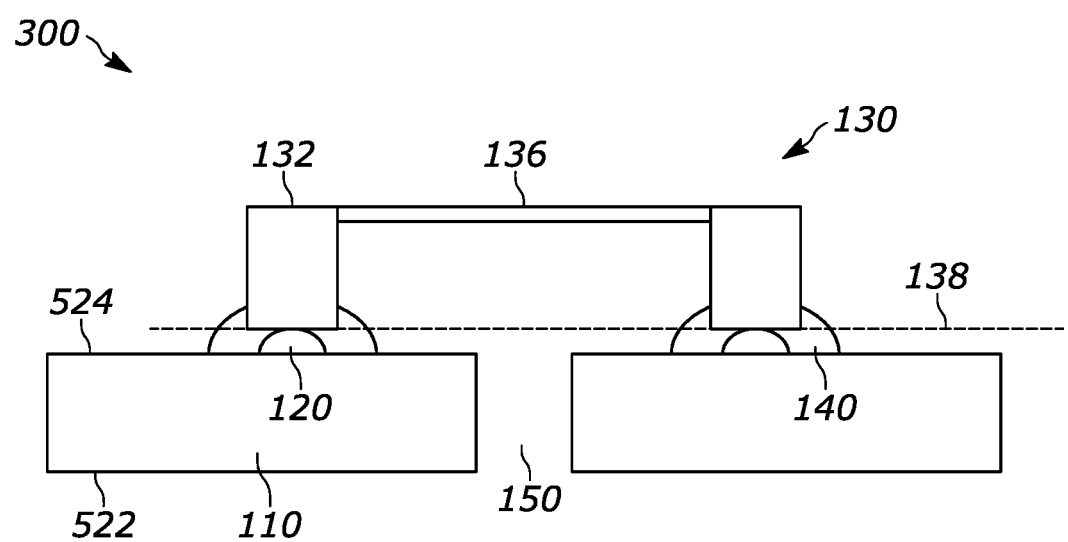
FIG. 3 is an example side sectional view of a portion of a transducer sub-assembly according to a possible embodiment.
Figure 4:
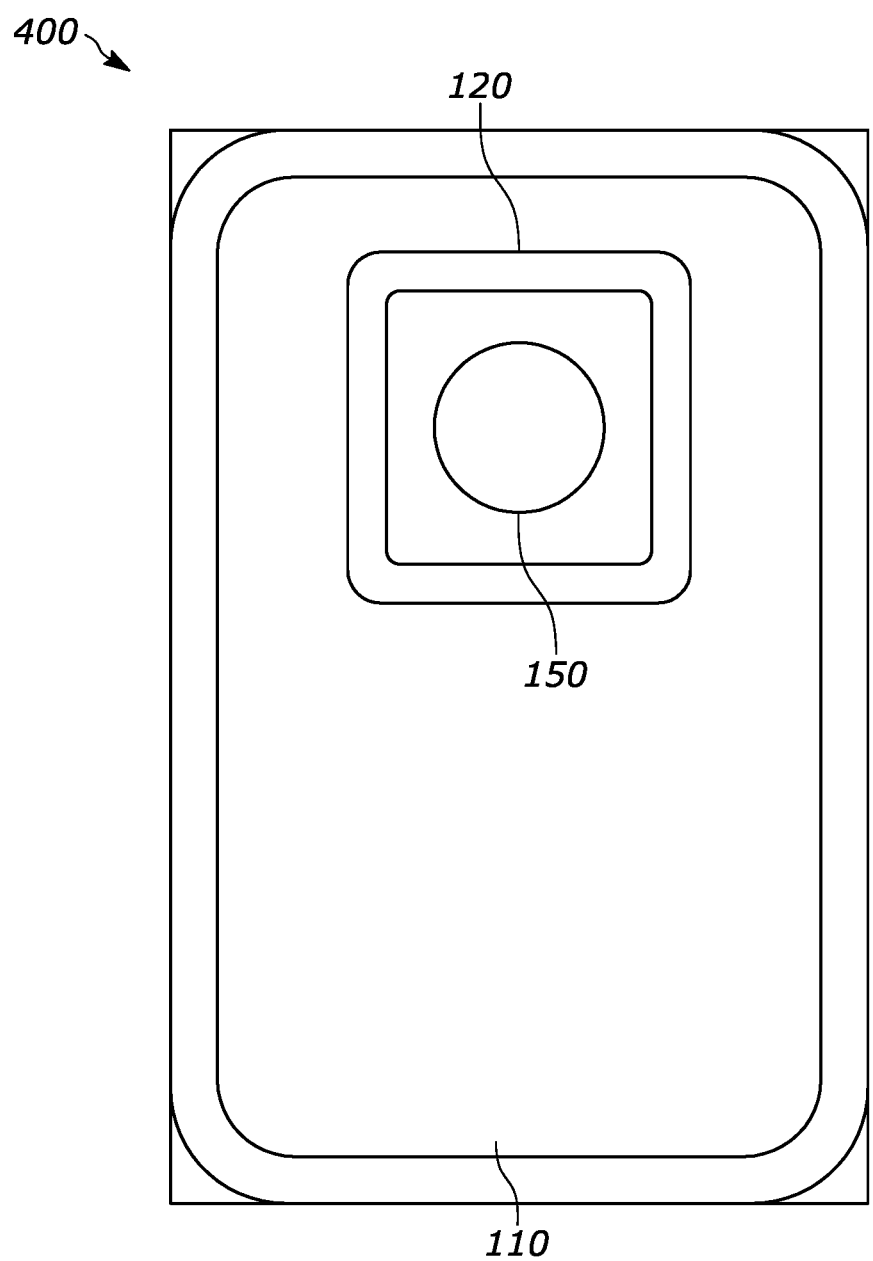
FIG. 4 is an example plan view of a transducer sub-assembly according to a possible embodiment.
Figure 5:
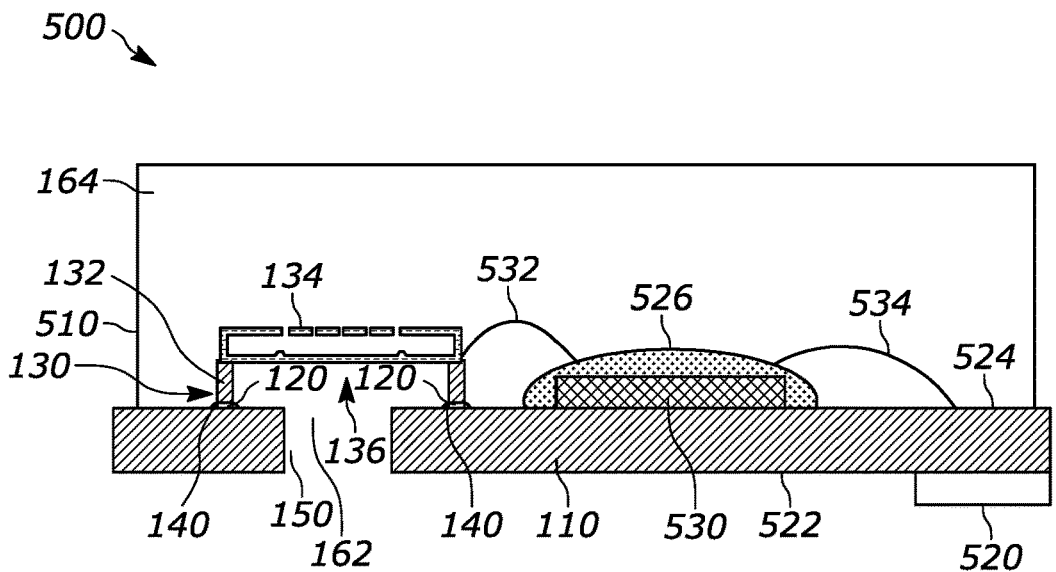
FIG. 5 is an example side view of a transducer assembly in the form of a sensor package according to a possible embodiment.

FIGS. 1 and 2 are an example top plan views of portions of a transducer sub-assembly 100 according to a possible embodiment, where FIG. 1 shows a schematic of the transducer sub-assembly 100 including a base 110 without a MEMS die and FIG. 2 shows a schematic of the transducer sub-assembly 100 including a base 110 with a MEMS die 130. FIG. 3 is an example side view of a transducer sub-assembly 300 according to a possible embodiment. FIG. 4 is an example top view of a transducer sub-assembly 400 according to a possible embodiment. FIG. 5 is an example side view of a transducer assembly in the form of a sensor package 500 according to a possible embodiment.

In FIGS. 1-5, a transducer assembly can include a base 110 on which a transducer can be mounted. In FIGS. 1 and 3-5, the transducer assembly can include a stress isolation standoff 120 located on the base 110. According to a possible embodiment, the stress isolation standoff 120 can have an elastic modulus of less than 100 MPa at room temperature. For example, a stress isolation standoff 120 can provide stress isolation by being soft in that it can have an elastic modulus of less than approximately 100 MPa (mega Pascals), less than 10 MPa, or other useful elastic modulus, at room temperature, which can be a range of softness that can be used for stress isolation of a MEMS die 130 from the base 110, such as a base substrate, to reduce the effects of stress, such as slight torsion, slight bending, and other stress, on the base 110 from the MEMS die 130. According to a possible embodiment, the stress isolation standoff 120 can also have a Shore A hardness of less than 75 or other useful Shore A hardness for providing stress isolation.

The transducer assembly can include a transduction element or transducer disposed on the stress isolation standoff. FIGS. 3 and 4 show a capacitive MEMS transducer 130 mounted on the standoff 120. In other embodiments, the transducer can be some other capacitive or non-capacitive transduction element, such as a piezo MEMS, an optical sensor, among other transduction elements that can benefit from stress isolation.

The depth, such as the height or thickness of the stress isolation standoff 120 from the base 110, can depend on the dimensions of the transducer assembly, can depend on the dimensions of the transducer such as size and thickness of the MEMS die 130, can depend on characteristics of die attach adhesive, can depend on the amount of stress isolation desired, and/or can depend on other characteristics of the transducer assembly.

In certain transducer assemblies, the depth of the stress isolation standoff 120 can be at least 15 μm, can have a target of 50-70 μm, can have a target of substantially 50 μm+/−10 μm, or can have any other useful depth. For example, certain transducer assemblies with a MEMS die 130 having an area between 0.7 and 4 mm$^2$ can use a stress isolation standoff 120 height of at least 25 μm. Softer materials for the stress isolation standoff 120 can be effective at lower ranges, such as 15 to 20 μm.

The transducer assembly can include the die attach adhesive 140 disposed between the MEMS die 130 and the base 110. The die attach adhesive 140 can bond the MEMS die 130 to the base 110. The stress isolation standoff 120 can be embedded in the die attach adhesive 140 between the base 110 and the MEMS die 130.

According to a possible embodiment of the transducer assembly 100, the stress isolation standoff 120 can include a plurality of stress isolation standoffs disposed between the MEMS die 130 and the base 110. For example, the plurality of stress isolation standoffs can include at least three posts, bumps, or other forms of stress isolation standoffs.

According to a possible embodiment of the transducer assembly, the stress isolation standoff 120 can have a rectangular shape deposited on the base 110. A rectangular shape can be a square, can have rounded edges, can have chamfered corners, can be slightly trapezoidal, or can be of any other shape that is in a general rectangular shape. The stress isolation standoff can also take other shapes, such as a circle, a polygon, or other closed or open shapes.

Referring to the transducer assembly 300 of FIG. 3, the MEMS die 130 can be attached to the base 110 via die attach adhesive 140 formed in a rectangular shape, as shown on the transducer assembly 400 of FIG. 4, or formed in other shapes. The die attach adhesive 140 can be formed in a rectangular shape or other shapes regardless of whether the stress isolation standoff 120 is a plurality of stress isolation standoffs, is a continuous line, or is a semi-continuous line of a stress isolation standoff, such as when in a rectangular shape or other shapes. For example, the die attach adhesive 140 can also take other shapes, such as a circle, a polygon, or other closed or open shapes. The die attach adhesive 140 can be deposited in a rectangular shape or other shape by jetting a line of adhesive, by depositing a plurality of dots of adhesive, by dispensing the rectangular shape with adhesive, of by any other way of creating a rectangular or other shape of adhesive.

Referring to FIG. 5, the transducer assembly can be a sensor package 500 that can include an enclosure 510, such as a cover or can, disposed on the base 110. The enclosure can enclose the MEMS die 130 between the enclosure 510 and the base 110. The sensor package 500 can include an external-device interface 520 disposed on the base 110. The external-device interface can be implemented as a surface-mount interface or can include leads configured for through-hole mounting on a host device.

The sensor package 500 can include an integrated circuit 530, such as an Application Specific Integrated Circuit (ASIC), electrically coupled to the MEMS die 130 and to contacts of the external-device interface 520, such as via an electrical lead 534 and/or leads running through the base 110. The integrated circuit 530 can receive an electrical signal from the MEMS die 130, such as via an electrical lead 532, and can communicate, such as via the electrical lead 534 and/or leads in the base 110, with a host device by using the contacts of the external device interface 520. According to a possible implementation, the integrated circuit 530 can be covered by a protective coating 526.

The external-device interface 520 can be disposed on a surface 522 of the base 110 that is on the opposite side of the base 110 from a surface 524 of the base 110 where the stress isolation standoff 120 and MEMS die 130 are located. According to a possible embodiment, a plane of the stress isolation standoff 120 can level a bottom plane 138 of the MEMS die 130, shown on the transducer assembly 300 of FIG. 3, to be substantially parallel with a surface 524 of the base 110.

According to a possible embodiment, the base 110 can include a sound port 150. The MEMS die 130 can be acoustically coupled to the sound port 150. For example, the sound port 150 can be an aperture in the base 110 that allows sound to pass through the base to the MEMS die 130. The stress isolation standoff 120 can be at least one stress isolation standoff and the die attach adhesive 140 can at least partially surround the sound port 150.

Illustrated embodiments can be considered a bottom port embodiment, but the sound port 150 can be located at other locations on the transducer assembly. For example, the sound port 150 can also be on the enclosure 510 for a top-port transducer assembly. The sound port 150 can further be on a side of the transducer assembly, can be anywhere else on the transducer assembly, or there can be no sound port 150, such as for a MEMS die vibration sensor or other sensor.

According to a possible embodiment, the MEMS die 130 can include a MEMS die substrate 132 coupled to the base 110 via the stress isolation standoff 120 and the die attach adhesive 140. The MEMS die 130 can include a back plate 134 coupled to the MEMS die substrate 132. The MEMS die 130 can include a diaphragm 136 coupled to the MEMS die substrate 132. The diaphragm 136 can be movably disposed relative to the back plate 134.

The diaphragm 136 can be acoustically coupled to the sound port 150. The back plate 134 can be disposed on the MEMS die substrate 132 on an opposite side of the diaphragm 136 from the sound port 150. The diaphragm 136 and backplate architecture can vary by MEMS transducer or other transducer or die type. For example, stress isolation standoffs can be used for any transduction element that can benefit from stress isolation. Such MEMS dies can include transducers with the diaphragm 136 and backplate 134 reversed, transducers with one diaphragm between two backplates, transducers with two diaphragms around one backplate, transducers with piezoelectric MEMS, and/or other MEMS dies. According to a possible implementation, a volume on the sound port 150 side of the diaphragm 136 can be considered a front volume 162 and a volume on the opposite side of the diaphragm 136 can be considered a back volume 164.

Figure 6:
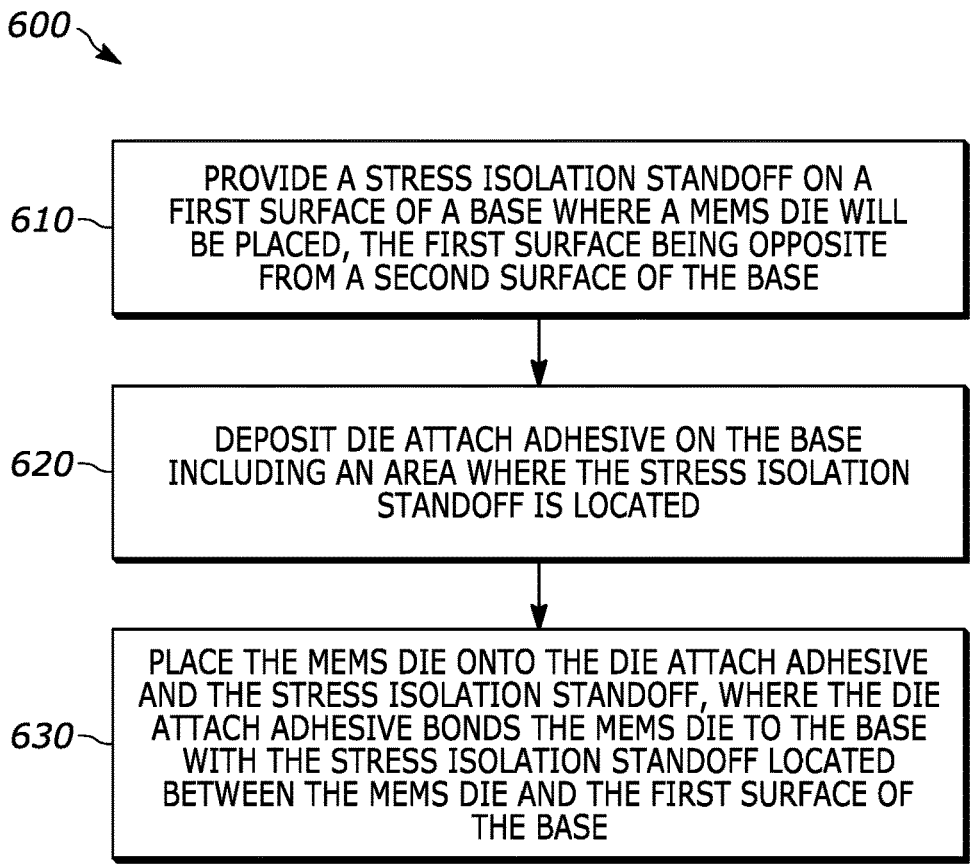
FIG. 6 is an example flowchart illustrating the operation of providing a stress isolation standoff for a MEMS die according to a possible embodiment.

FIG. 6 is an example flowchart 600 illustrating the operation of providing a stress isolation standoff for a MEMS die or any other transducer according to a possible embodiment. At 610, a stress isolation standoff can be provided on a first surface of a base where a MEMS die will be placed. The first surface can be opposite from a second surface of the base. The stress isolation standoff can be provided, such as created, primarily at locations where the MEMS die will contact the base, such as in a pattern that matches the area the MEMS die will contact the base via the standoffs. According to a possible embodiment, the stress isolation standoff can have an elastic modulus of less than 100 MPa at room temperature.

According to a possible embodiment, the MEMS die can include an area of contact that contacts the die attach adhesive. Providing the stress isolation standoff can include creating the stress isolation standoff in a pattern that matches at least part the area of contact of the MEMS die.

According to a possible embodiment, providing the stress isolation standoff can include at least any one of screen printing, jetting, and/or needle dispensing the stress isolation standoff on the first surface on the base. Furthermore, any methods for depositing a liquid or paste adhesive on a substrate, such as the base, can be used to provide, such as create, the soft standoffs. According to a possible embodiment, after depositing the liquid or paste adhesive to create the soft standoffs, the adhesive can be cured and the die attach adhesive can be deposited on the base including the area where the cured stress isolation standoffs are located. According to other possible embodiments, the stress isolation standoffs can be grown, deposited as dots, or otherwise provided on the base. For example, according to a possible embodiment, the stress isolation standoff can include a plurality of stress isolation standoffs disposed between the MEMS die, such as a MEMS die substrate, and the base.

According to a possible embodiment, the stress isolation standoff can have a rectangular shape that is deposited on the base. For example, a rectangular shape can be a square, can have rounded edges, can have chamfered corners, or can be of any other shape that is in a general rectangular shape. As a further example, depositing the die attach adhesive can include depositing the die attach adhesive in a rectangular shape on the base. The MEMS die can be attached to the base via the die attach adhesive in a rectangular shape.

At 620, die attach adhesive can be deposited on the base including an area where the stress isolation standoff is located. At 630, the MEMS die can be placed onto the die attach adhesive and the stress isolation standoff. The die attach adhesive can bond the MEMS die to the base with the stress isolation standoff located between the MEMS die and the first surface of the base. According to a possible embodiment, an external device interface with electrical contacts can be formed on the second surface of the base.

According to at least some embodiments, the standoffs can provide isolation for a MEMS die or any other transducer from its package. The standoffs can be pre-patterned on a base, such as a substrate, with high throughput and low cost while staying with traditional MEMS die placement method. The standoffs can be of a substantially uniform height so the base of the MEMS die is co-planar with the surface of the substrate.

Embodiments can be applicable to both non-constrained and constrained diaphragms. Non-constrained diaphragms can be usually only attached at one or two locations. Constrained diaphragms, such as tensioned diaphragms, can be attached around an entire perimeter of the diaphragm. Embodiments can also cover variations in transducer designs. For example, some transducers can have two diaphragms, can have a back plate on different sides of diaphragm, can have diaphragm in middle of two back plates, can have two diaphragms and one back plate, can be piezo MEMS, and/or can have or can be other variations of transducers.

Embodiments can provide discrete standoffs that can be formed on a substrate and die attach adhesive can be deposited over the standoffs and the substrate. The standoffs can be deposited by screen printing, or otherwise deposited or formed before die attach adhesive is deposited. The standoffs can be discrete points or can be a single line or multiple lines of standoff material placed on the substrate in a pattern that matches the area of the bottom of a transducer that will contact the standoffs and the adhesive.

According to at least some embodiments, a MEMS microphone die and other MEMS die, such as pressure or other sensors, can use a soft die attach material with sufficient bond line thickness to achieve a stress isolation for desired performance. A soft standoff, such as a stress isolation standoff can set a bond line for the MEMS die. Dots of soft material under the die can set the bond line. Dots can be screen printed, jetted, needle dispensed, or otherwise placed or formed on a surface. Photolithography is also possible using a soft material. Shapes other than dots can also be used. Additional soft die attach material can be used over and around the soft standoffs to bond the die to the surface.

At least some methods of this disclosure can be implemented on a programmed processor. However, the circuits, flowcharts, and operations may also be implemented on a general purpose or special purpose computer, a programmed microprocessor or microcontroller and peripheral integrated circuit elements, an integrated circuit, a hardware electronic or logic circuit such as a discrete element circuit, a programmable logic device, or the like. In general, any device on which resides a finite state machine capable of implementing the flowcharts shown in the figures may be used to implement the processor functions of this disclosure.

Also, while this disclosure has been described with specific embodiments thereof, it is evident that many alternatives, modifications, and variations will be apparent to those skilled in the art. For example, various components of the embodiments may be interchanged, added, or substituted in the other embodiments. Also, all of the elements of each figure are not necessary for operation of the disclosed embodiments. For example, one of ordinary skill in the art of the disclosed embodiments would be enabled to make and use the teachings of the disclosure by simply employing the elements of the independent claims. Accordingly, embodiments of the disclosure as set forth herein are intended to be illustrative, not limiting. Various changes may be made without departing from the spirit and scope of the disclosure.

In this document, relational terms such as "first," "second," and the like may be used solely to distinguish one entity or action from another entity or action without necessarily requiring or implying any actual such relationship or order between such entities or actions. The phrase "at least one of,'" "at least one selected from the group of," or "at least one selected from" followed by a list is defined to mean one, some, or all, but not necessarily all of, the elements in the list. The terms "comprises," "comprising," "including," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a," "an," or the like does not, without more constraints, preclude the existence of additional identical elements in the process, method, article, or apparatus that comprises the element. Also, the term "another" is defined as at least a second or more. The terms "including," "having," and the like, as used herein, are defined as "comprising." Furthermore, the background section is not admitted as prior art, is written as the inventor's own understanding of the context of some embodiments at the time of filing, and includes the inventor's own recognition of any problems with existing technologies and/or problems experienced in the inventor's own work.

I claim:

1. A transducer assembly comprising:
   a base;
   a stress isolation standoff located on the base;
   a Microelectromechanical Systems (MEMS) die disposed on the stress isolation standoff; and
   a die attach adhesive disposed between the MEMS die and the base, the die attach adhesive bonding the MEMS die to the base, the stress isolation standoff embedded in the die attach adhesive between the base and the MEMS die.

2. The transducer assembly according to claim 1, wherein the stress isolation standoff has an elastic modulus of less than 100 MPa at room temperature.

3. The transducer assembly according to claim 1, wherein the stress isolation standoff comprises a plurality of stress isolation standoffs disposed between the MEMS die and the base.

4. The transducer assembly according to claim 3, wherein the plurality of stress isolation standoffs comprise at least three posts.

5. The transducer assembly according to claim 1, wherein the stress isolation standoff comprises a rectangular shape deposited on the base.

6. The transducer assembly according to claim 1, wherein the MEMS die is attached to the base via die attach adhesive formed in a rectangular shape.

7. The transducer assembly according to claim 1, further comprising:
   an enclosure disposed on the base, the enclosure enclosing the MEMS die between the enclosure and the base;
   an external-device interface disposed on the base; and
   an integrated circuit electrically coupled to the MEMS die and to contacts of the external-device interface, where the integrated circuit receives an electrical signal from the MEMS die and communicates with a host device via the contacts of the external-device interface.

8. The transducer assembly according to claim 1,
   wherein the base includes a sound port,
   wherein the MEMS die is acoustically coupled to the sound port,
   wherein the stress isolation standoff comprises at least one stress isolation standoff, and
   wherein the die attach adhesive at least partially surrounds the sound port.

9. The transducer assembly according to claim 1, wherein the MEMS die comprises:
   a MEMS die substrate coupled to the base via the stress isolation standoff and the die attach adhesive;
   a back plate coupled to the MEMS die substrate; and
   a diaphragm coupled to the MEMS die substrate, the diaphragm movably disposed relative to the back plate.

10. The transducer assembly according to claim 1, wherein a plane of the stress isolation standoff levels a bottom plane of the MEMS die to be substantially parallel with a surface of the base.

\* \* \* \* \*